United States Patent [19]

Tailliet

[11] Patent Number: 5,515,226

[45] Date of Patent: May 7, 1996

[54] INTEGRATED CIRCUIT INCORPORATING A SYSTEM OF PROTECTION AGAINST ELECTROSTATIC DISCHARGES

[75] Inventor: FranÂois Tailliet, Epinay Sur Seine, France

[73] Assignee: SGS-Thomson Microelectronics, S. A., Gentilly, France

[21] Appl. No.: 377,088

[22] Filed: Jan. 25, 1995

[51] Int. Cl.⁶ ............................. H02H 3/20; H01L 23/62
[52] U.S. Cl. ............................. 361/56; 361/91; 257/355
[58] Field of Search ................... 361/54, 56, 57, 361/88, 91, 111; 257/355, 356, 357, 358, 359, 360, 361, 362, 363, 589, 603

[56] References Cited

U.S. PATENT DOCUMENTS 4,819,047  4/1989  Gilfeather et al. ................. 361/56
4,945,395  7/1990  Suehiro .............................. 257/203

*Primary Examiner*—A. D. Pellinen
*Assistant Examiner*—Michael J. Sherry
*Attorney, Agent, or Firm*—Robert Groover; Betty Formby

[57] ABSTRACT

In an integrated circuit with protection against electrostatic discharges, there is provided a first voltage limiter connected between a pad to be protected and a ground bus. This first limiter is placed the peripheral part of the integrated circuit in the vicinity of the pad And there is provided a second voltage limiter directly connected to a circuit element to be protected. This second limiter is placed in the useful part of the integrated circuit and not in the peripheral part. Thus, the risks related to the resistors of the ground bus, crossed by high electrostatic discharge currents, are avoided.

21 Claims, 1 Drawing Sheet

INTEGRATED CIRCUIT INCORPORATING A SYSTEM OF PROTECTION AGAINST ELECTROSTATIC DISCHARGES

CROSS-REFERENCE TO RELATED APPLICATION

This application claims priority from French App'n 94-00784, filed 01/25/94, which is hereby incorporated by reference. However, the content of the present application is not necessarily identical to that of the priority application.

BACKGROUND AND SUMMARY OF THE INVENTION

The invention relates to integrated circuits that are sensitive to the risks of malfunctioning or destruction in the presence of electrostatic discharges, notably circuits made by MOS (metal-oxide-semiconductor) technology.

Electrostatic discharges can arise sometimes quite simply because a user touches the external terminals providing access to the integrated circuit chip. This risk may become very great with integrated circuits that are much handled. This is the case for example with circuits incorporated into chip cards: not only are the chip cards subjected to heavy handling but the access contacts are directly accessible without any mechanical protection or shielding device.

A known way of protecting integrated circuits against the risks of electrostatic discharge is to place electronic protection devices on the chip, each positioned in the immediate vicinity of a respective access pad. Each protection device is connected between an access pad and a ground pad (or more exceptionally between an access pad and another supply pad). The pads that are designed to receive an input signal at high input impedance are especially liable to undergo this arrangement.

FIG. 1 shows the general configuration of an integrated circuit chip, referenced IC, having a central part UC in which there is placed the active part of the circuit and a peripheral part surrounding the central part and having the access pads that enable the connection of the integrated circuit to the exterior. The pads are generally designed to receive soldered wires. Each pad is connected to the active part UC of the integrated circuit, to send it a voltage signal or a current signal or, on the contrary, to receive a signal therefrom. In FIG. 1, Pj designates one of these pads, connected by a conductor Cj to an input Ej of the active part of the integrated circuit. Hereinafter, the term "input Ej" shall be used to designate any point of a circuit that has to be connected to a pad Pj, even if, functionally, this "input" is actually an output of a signal to the exterior rather than an input of a signal coming from the exterior. P1 designates a ground pad normally held at a low potential Vss and P2 designates a supply pad giving a supply voltage Vcc. The pad P1 is generally connected to a conductive bus BM which conveys the ground potential all around the chip to bring it to various places of the circuit that need this potential. The same is generally the case with the supply pad at Vcc. However, no bus at Vcc has been shown in order to avoid burdening FIG. 1.

In a standard way, the devices for protection against electrostatic discharges are localized in the peripheral part of the integrated circuit, in the immediate vicinity of each pad to be protected.

The device used to protect a pad generally has a voltage limiter, connected between the pad to be protected and the common ground terminal. Its main function is to become suddenly conductive when the voltage at its terminals goes beyond a determined threshold. It thus shunts the energy of the electrostatic discharge received towards the ground. This voltage limiter naturally has a higher capacity of resistance to the energy received than the other elements of the integrated circuit, and it is furthermore designed to become conductive before the elements to be protected receive any harmful overvoltage.

FIG. 2 shows the simplest configuration generally used to protect a pad Pj connected by a conductor Cj to an input Ej of the active part of the integrated circuit. The input Ej is a point of a circuit element ELj which firstly must be connected to the pad Pj for the normal operation of the integrated circuit and, secondly, must be protected against electrostatic discharges. The element ELj is for example simply a transistor of the integrated circuit and, and the input Ej may be the gate of this transistor, incapable of withstanding excessively high voltages. It could also be a transistor source or drain acting as a signal input or output in a call exchanged with the exterior.

In the immediate vicinity of the pad Pj, in the peripheral zone of the integrated circuit, there is a limiter EC1j. It is connected between the pad Pj and the ground bus BM which passes near the pad.

The electrostatic discharges which are sufficient to activate the conduction of the limiter EC1j are diverted towards the ground bus BM, thus preventing overvoltages from appearing at the conductor Cj and hence at the input Ej. The arrangement is the same for the other pads to be protected with, for each pad, a limiter placed in the vicinity of the pad, connected between the pad and the ground bus BM.

The limiter element may be a simple diode whose anode is connected to the ground bus and whose cathode is connected to the pad to be protected (it assumed, as is almost always the case, that the ground terminal is the most negative supply terminal; otherwise the connections should be reversed).

The diode remains normally off while the voltage at the terminal to be protected does not go beyond an avalanche threshold. If the threshold is crossed, the diode becomes conductive and absorbs the current of the electrostatic discharge that has made it conductive. The limiter may also be a transistor.

It has been observed that this type of protection is not always satisfactory, inasmuch as malfunctioning or destruction could occur when electrostatic discharges are applied to the pads to be protected.

An aim of the present invention is to increase the effectiveness of electrostatic protection devices.

According to the invention, it is proposed to place another voltage limiter in the active part of the integrated circuit, in the immediate vicinity of a circuit element to be protected. This second limiter does not need to have a large capacity of current flow. It may be far more compact than the first limiter, so that it can be placed without any great inconvenience inside the integrated circuit in which there is located a circuit element (input transistor gate for example)to be protected particularly. Its trigger voltage is preferably substantially the same as that of the first limiter and its value is naturally chosen as a function of the voltage level that can be applied without damage to the circuit element to be protected.

The presence of this second limiter improves the protection in a way that shall be explained further below.

Consequently, the invention proposes an integrated circuit having an active central part surrounded by a peripheral part, the peripheral part having access pads connected respectively to circuit elements to be protected located in the active central part, with a voltage limiter device located in the vicinity of each pad in the peripheral part and connected between the pad and a common ground bus, wherein said integrated circuit comprises, for certain pads connected to a respective circuit element to be protected, a second voltage limiter placed in the central part of the integrated circuit, in the immediate vicinity of the circuit element to be protected.

A second limiter is not necessary for all the pads, as shall be seen: it is possible to use only one limiter for those circuit elements needing protection that are geographically quite close to the pad to which they are connected. The elements that are further away use a second limiter according to the invention. Furthermore, those circuit elements to be protected that are connected to pads which are themselves located sufficiently close to the pad to be protected could use only one limiter located in the peripheral part.

Preferably, a resistor is interposed between a respective pad and the circuit element corresponding to this pad and having to be protected. It limits the current directed towards this element and introduces a voltage drop between the pad and the second limiter as soon as a current flows in the second limiter.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
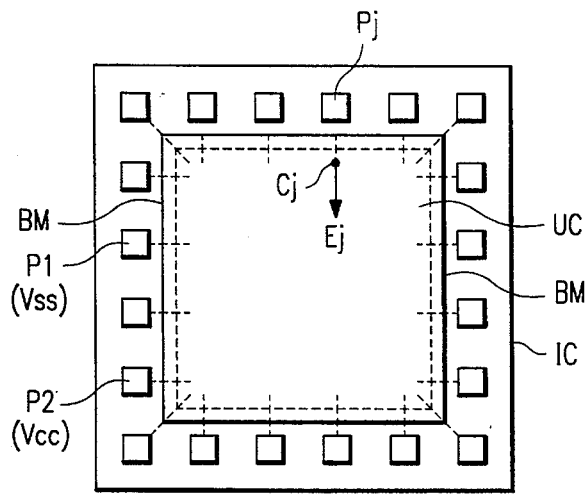
FIG. 1, already described, shows the general configuration of an integrated circuit.
Figure 2:
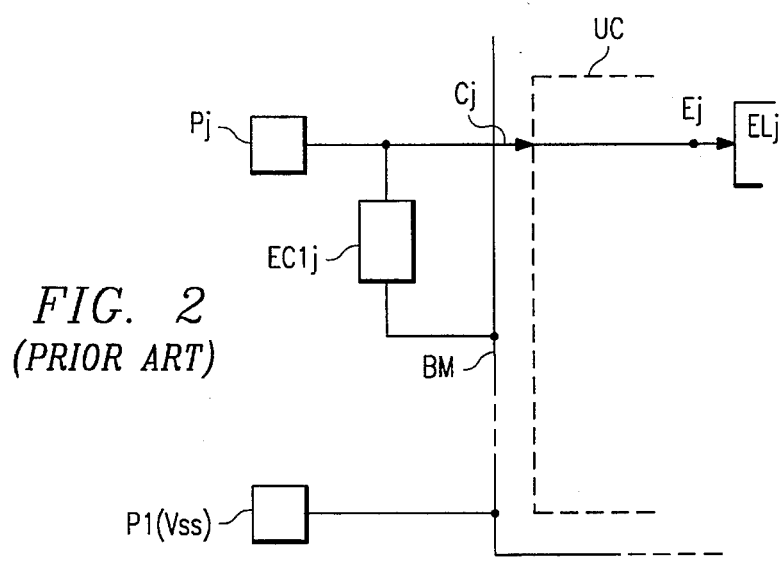
FIG. 2 shows the standard arrangement of a protection limiter in the vicinity of a pad.

The numerous innovative teachings of the present application will be described with particular reference to the presently preferred embodiment (by way of example, and not of limitation), in which:

In the study of what happens during an electrostatic discharge in the protection device of FIG. 2, it has been realized that when the discharge current shunted by the voltage limiter EC1j is high, it creates a major drop in voltage in the ground bus BM between the pad Pj to be protected and the ground pad P1.

Indeed, the electrostatic discharge on the pad Pj causes the limiter EC1j to be placed in a state of conduction, shunting the discharge current towards the ground BM and from there towards the ground pad P1. The ground bus is an aluminum conductor deposited on the integrated circuit, the linear resistance of this aluminum conductor being not zero. The width of the bus is indeed limited by considerations of available space. This width may go up to about 20 micrometers but hardly more. The thickness of the bus is defined by the technology for all the conductors of the circuit and is in the range of 1 micrometer.

The resistance of the ground bus, while it is low, introduces a voltage drop which is all the greater as the pad P1 is further from the pad Pj corresponding to the input of the circuit Ej to be protected. The length of the bus BM crossed by the discharge current may be several millimeters.

The result thereof is that the potential difference between the pad Pj and the ground pad P1 which removes the discharge current is not the voltage VM dictated by the limiter EC1j but the sum of the voltage VM and the voltage drop RI in the bus portion BM located between the pads Pj and P1. This voltage drop may be equal to several volts or even several tens of volts in the case of high discharges. The input Ej inside the integrated circuit is then subjected to a potential essentially equal to the sum, and this potential, in certain cases, may be far too high.

This is why, according to the invention, it is proposed to place a second limiter in the vicinity of the input Ej to be protected, hence in the active part UC of the integrated circuit.

Figure 3:
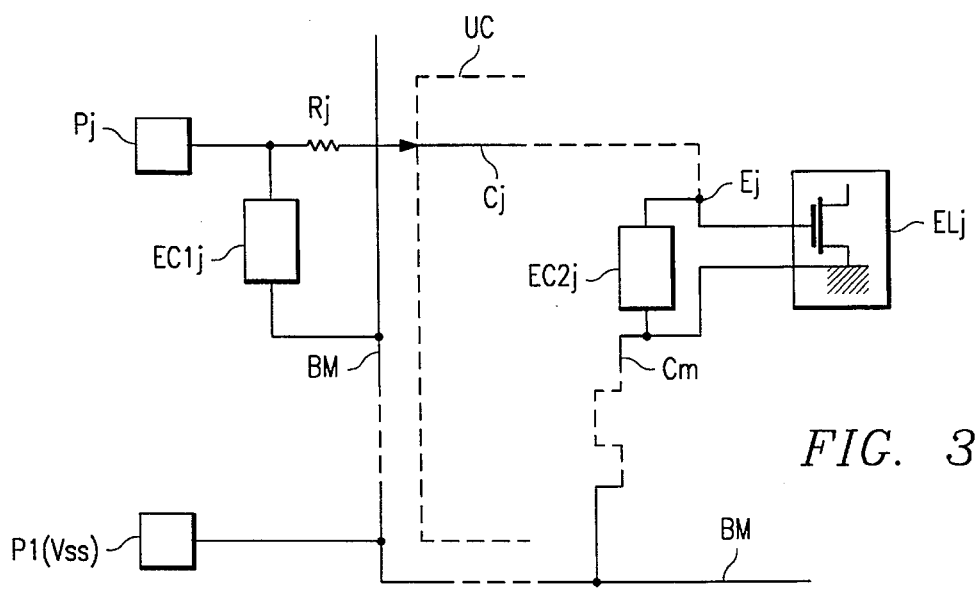
FIG. 3 shows the configuration of a protection device adopted in an integrated circuit according to the invention.

FIG. 3 shows an arrangement according to the invention, applied to the protection of an input Ej connected to a pad Pj. The circuit element ELj whose input Ej is to be protected is, here too, located in the active part UC of the integrated circuit. It is at a distance from the pad Pj and is connected to it by a conductor Cj and, as shall be seen further below, by a resistor Rj.

The input Ej is further connected by a limiter EC1j identical to the one described with reference to FIG. 2. This limiter is placed in the peripheral part of the integrated circuit, between the pad Pj and the ground bus BM.

A second limiter EC2j is, on the contrary, located in the active part UC and is preferably placed in the immediate vicinity of the circuit element ELj to be protected. It is connected firstly to the input Ej and secondly to a conductor Cm connected to the ground bus BM;

A resistor Rj is series-connected with the conductor Cj, between the pad Pj and the input Ej of the circuit element ELj. Its value may range from some hundreds to some thousands of ohms. Its higher value is limited at the top only when the input impedance of the element ELj is low. Indeed, in this case, the resistor Rj introduces a voltage drop in normal operation and this voltage drop must be limited so that the operation remains acceptable. However, if the input Ej is a field-effect transistor gate or another element with high input impedance, the value of the resistor Rj is not of critical importance. It will be chosen so as to be sufficiently high to limit the current in the second limiter EC2j to an acceptable value (that depends on the dimensions of the limiter EC2j).

The protection device according to the invention works as follows: when an electrostatic discharge reaches the access pad Pj, the first limiter EC1j becomes conductive and receives the major part of the current of the discharge. The resistance of the ground bus may be of the order of 50 milliohms per square. For a ground bus BM having a width of 20 micrometers and a length of 2 millimeters between the pad Pj and the ground pad P1, this corresponds to 100 squares lengthwise, giving a resistance of about 5 ohms. If the discharge current is equal to some amperes, a voltage drop of several volts (for example about 20 volts for a current of 4 amperes) may occur in the ground bus BM between the pad P1 and the pad Pj.

This voltage drop gets added to the voltage at the terminals of the first limiter to set up a potential difference between the input Ej and the ground potential. This voltage would be too high and would risk causing the destruction of the integrated circuit. However, this sum of voltages is also transferred to the terminals of the second limiter EC2j by means of the conductors Cj and Cm. The second limiter becomes conductive before this sum of voltages reaches a critical level. This is what happens notably if the conduction threshold voltage of the second limiter is the same as that of the first limiter, but also when it is slightly higher. The energy of the discharge of the second limiter (which is a fraction of the total energy of the electrostatic discharge) is then shunted to the ground conductor Cm. The circuit element ELj is therefore protected. The current consumed by the placing of the second limiter in a state of conduction is limited by the resistor Rj. The second limiter may therefore have a limited size. Typically, the size ratio between the inner and outer voltage limiter is between 1:5 and 1:10. The main current of the discharge is still removed towards the ground pad P1 by the first limiter but the harmful effect of the resistance of the ground bus is to a great extent eliminated.

Although it would have been possible to provide for only one limiter which would have been the second limiter, located in the active part UC of the integrated circuit, it is preferred to have a main limiter (the one that is capable of removing the major part of the discharge current) remaining in the peripheral part of the circuit, the second limiter having only an auxiliary function. Indeed, it is preferable to limit the position of the high current or high voltage zones to outside the active part of the circuit. This improves the ability of the circuit to resist untimely activation of parasitic thyristors present in the integrated circuit. This also prevents the charge carriers spread by the limiter during the discharging from harming the internal logic (through the deterioration of transistors, the parasitic programming of memory cells, etc.). If the first limiter did not exist, all the discharge current would flow right in the middle of the active part of the integrated circuit. This would then necessitate the drawing, towards the interior of the circuit, of metal lines connected to the ground pad P1, these lines being wide enough to withstand currents of several amperes: this would entail a very bulky structure.

The limiting voltage of the first limiter is preferably between 10 volts and 20 volts for $V_{cc}=5$ volts (of course for technologies using a different supply voltage, these values would change). This voltage is chosen so that the power dissipated in this limiter is low enough. It is the second limiter, placed after the resistor Rj, that fixes the residual discharge voltage present inside the active part of the integrated circuit. A discharge voltage of 15 volts is generally appropriate for standard integrated circuits using CMOS technology on silicon.

The resistor Rj is preferably formed by an N+ type diffusion in a P type substrate. It limits the current in the second limiter and may have a value of some kilohms. The current will be limited to several milliamperes or several tens of milliamperes at most, thus making it possible to build a compact limiter EC2j.

The limiter EC2j, like the limiter EC1j, may be formed by a diode capable of going into avalanche mode in the event of overvoltage or again by a transistor or even a thyristor.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit, comprising:
   a plurality of operating circuit elements, having signal connections thereto;
   a plurality of externally accessible contact pads, wherein some of said contact pads are connected to ones of said signal connections of said operating circuit elements, and at least some others of said contact pads are connected to first and second power supply connections;
   wherein said contact pads are located in a peripheral zone of the integrated circuit, and at least some ones of said operating circuit elements are located in a central zone of the integrated circuit;
   a plurality of first voltage limiters, each located in said peripheral zone in proximity to a respective one of said contact pads, and each connected to limit the voltage of a respective one of said signal connections; and
   a plurality of second voltage limiters, each located in said central zone in proximity to a respective one of said signal connections to a respective one of said operating circuit elements, and each connected to limit the voltage of a respective one of said signal connections;
   wherein at least some ones of said signal connections are electrically connected both to one of said first voltage limiters and also to one of said second voltage limiters.

2. An integrated circuit as in claim 1, wherein a size ratio of said second voltage limiters to said first voltage limiters is between 1:5 and 1:10.

3. An integrated circuit as in claim 1, wherein said first power supply is 5 volts.

4. An integrated circuit as in claim 1, wherein said first and said second voltage limiters are diodes capable of going into avalanche mode in the event of overvoltage.

5. An integrated circuit as in claim 1, wherein the limiting voltage of said first voltage limiters is between 10 and 20 volts.

6. An integrated circuit, comprising:
   a plurality of operating circuit elements, located in a central zone of the integrated circuit, and having signal connections thereto;
   a plurality of externally accessible contact pads located in a peripheral zone of the integrated circuit, wherein some of said contact pads are connected to ones of said signal connections of said operating circuit elements, and at least some others of said contact pads are connected to first and second power supply connections;
   a plurality of first voltage limiters, each located in said peripheral zone in proximity to a respective one of said contact pads, and each connected to limit the voltage of a respective one of said signal connections;
   a plurality of second voltage limiters, each located in said central zone in proximity to a respective one of said signal connections to a respective one of said operating circuit elements, and each connected to limit the voltage of a respective one of said signal connections; and
   a plurality of signal routing lines which each make connection:
      at one end thereof, to one of said first voltage limiters and also to one of said contact pads; and
      at the other end thereof, to one of said second voltage limiters and also to a respective one of said signal connections to a respective one of said operating circuit elements.

7. An integrated circuit as in claim 6, wherein a size ratio of said second voltage limiters to said first voltage limiters is between 1:5 and 1:10.

8. An integrated circuit as in claim 6, wherein said first power supply is 5 volts.

9. An integrated circuit as in claim 6, wherein said first and said second voltage limiters are diodes capable of going into avalanche mode in the event of overvoltage.

10. An integrated circuit as in claim 6, wherein the limiting voltage of said first voltage limiters is between 10 and 20 volts.

11. An integrated circuit, comprising:
- a plurality of operating circuit elements, having signal connections thereto;
- a plurality of externally accessible contact pads, wherein some of said contact pads are connected to ones of said signal connections of said operating circuit elements, and at least some others of said contact pads are connected to first and second power supply connections;
- wherein said contact pads are located in a peripheral zone of the integrated circuit, and at least some ones of said operating circuit elements are located in a central zone of the integrated circuit;
- a plurality of resistors, each connected in series between a respective one of said contact pads and a respective one of said signal connections of said operating circuit elements;
- a plurality of first voltage limiters, each located in said peripheral zone in proximity to a respective one of said contact pads, and each connected to limit the voltage of a respective one of said signal connections; and
- a plurality of second voltage limiters, each located in said central zone in proximity to a respective one of said signal connections to a respective one of said operating circuit elements, and each connected to limit the voltage of a respective one of said signal connections;
- wherein at least some ones of said signal connections are electrically connected both to one of said first voltage limiters and also to one of said second voltage limiters.

12. An integrated circuit as in claim 11 wherein a size ratio of said second voltage limiters to said first voltage limiters is between 1:5 and 1:10.

13. An integrated circuit as in claim 11 wherein said resistors are N+ diffusions in a P type substrate.

14. An integrated circuit as in claim 11 wherein said first power supply is 5 volts.

15. An integrated circuit as in claim 11 wherein said first and said second voltage limiters are diodes capable of going into avalanche mode in the event of overvoltage.

16. An integrated circuit as in claim 11 wherein the limiting voltage of said first voltage limiters is between 10 and 20 volts.

17. A method for protecting an integrated circuit against electrostatic discharges, comprising the steps of:

(a.) providing an integrated circuit which comprises a plurality of operating circuit elements in a central zone of the integrated circuit and having signal connections thereto; a plurality of externally accessible contact pads located in a peripheral zone of the integrated circuit and connected to ones of said signal connections of said operating circuit elements; a plurality of first voltage limiters, each located in said peripheral zone in proximity to a respective one of said contact pads, and each connected to limit the voltage of a respective one of said signal connections; and a plurality of second voltage limiters, each located in said central zone in proximity to a respective one of said signal connections to a respective one of said operating circuit elements, and each connected to limit the voltage of a respective one of said signal connections; wherein at least some ones of said signal connections are electrically connected both to one of said first voltage limiters and also to one of said second voltage limiters;

(b.) clamping the voltage of transients in one or more of said first voltage limiters, to absorb the majority of the energy thereof; and (c.) clamping any remaining portion of each transient in one or more of said second voltage limiters, to protect said operating circuits against damage.

18. An integrated circuit having an active central part surrounded by a peripheral part, the peripheral part having access pads connected respectively to circuit elements to be protected located in the active central part, with a voltage limiter device located in the vicinity of each pad in the peripheral part and connected between the pad and a common ground bus, wherein said integrated circuit comprises, for certain pads connected to a respective circuit element to be protected, a second voltage limiter placed in the central part of the integrated circuit, in the immediate vicinity of the circuit element to be protected.

19. An integrated circuit element according to claim 18, wherein a resistor is interposed between a respective pad and the corresponding circuit element to be 5protected.

20. The integrated circuit of claim 18, wherein the second limiter is connected between a conductor connected between the circuit element to be protected and an access pad, and a second conductor connected to the ground bus.

21. The integrated circuit of claim 19, wherein the second limiter is connected between a conductor connected between the circuit element to be ;protected and an access pad, and a second conductor connected to the ground bus.

* * * * *

UNITED STATES PATENT AND TRADEMARK OFFICE
CERTIFICATE OF CORRECTION

PATENT NO.  : 5,515,226
DATED       : May 7, 1996
INVENTOR(S) : Tailliet

It is certified that error appears in the above-indentified patent and that said Letters Patent is hereby corrected as shown below:

On the Title page, Item [75];

The inventor's name is François Tailliet

Signed and Sealed this

Ninth Day of July, 1996

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,515,226
APPLICATION NO. : 08/377088
DATED : May 7, 1996
INVENTOR(S) : FranÅois Tailliet It is certified that error appears in the above-identified patent and that said Letters Patent is hereby corrected as shown below:

Column 8, line 41, "5protected" should be --protected--.

Column 8, line 48, ";protected" should be --protected--.

Signed and Sealed this

Twenty-seventh Day of January, 2009

JOHN DOLL
*Acting Director of the United States Patent and Trademark Office*